US011336427B1

(12) United States Patent
Elkanovich et al.

(10) Patent No.: US 11,336,427 B1
(45) Date of Patent: May 17, 2022

(54) CIRCUIT OF COMMUNICATION INTERFACE BETWEEN TWO DIES AND METHOD TO MANAGE COMMUNICATION INTERFACE

(71) Applicants: Global Unichip Corporation, Hsinchu (TW); Taiwan Semiconductor Manufacturing Company, Ltd., Hsinchu (TW)

(72) Inventors: Igor Elkanovich, Hsinchu (TW); Yen-Chung T. Chen, Santa Clara, CA (US); Chia-Hsiang Chang, Hsinchu (TW); Ting-Hsu Chien, Hsinchu County (TW); Tsai-Ming Yang, Hsinchu (TW); Wei-An Liang, Hsinchu (TW); Amnon Parnass, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/185,895

(22) Filed: Feb. 25, 2021

(51) Int. Cl.
  *H04B 1/38* (2015.01)
  *H04L 5/16* (2006.01)
  *H04L 7/06* (2006.01)
  *H04L 7/04* (2006.01)

(52) U.S. Cl.
  CPC ............... *H04L 7/06* (2013.01); *H04L 7/042* (2013.01)

(58) Field of Classification Search
  CPC ......... H04L 7/06; H04L 7/042; H04L 49/109; G06F 13/4291; H04B 1/30

USPC ....... 375/257, 258, 219, 220, 326, 327, 373, 375/355
See application file for complete search history.

(56) References Cited

U.S. PATENT DOCUMENTS

| | | | |
|---|---|---|---|
| 7,072,406 B1 * | 7/2006 | Harma | G06F 13/4291 375/257 |
| 7,447,491 B2 * | 11/2008 | Khoini-Poorfard | H04B 1/30 455/209 |
| 9,748,960 B2 * | 8/2017 | Zerbe | H03L 7/0802 |
| 9,766,288 B2 | 9/2017 | Huang et al. | |
| 10,037,293 B2 | 7/2018 | Chen et al. | |
| 10,038,647 B1 * | 7/2018 | Lesea | H04L 49/109 |
| 10,127,169 B2 | 11/2018 | Su | |
| 10,152,445 B2 | 12/2018 | Su | |
| 10,261,928 B2 | 4/2019 | Chen et al. | |

* cited by examiner

*Primary Examiner* — Phuong Phu
(74) *Attorney, Agent, or Firm* — JCIPRNET

(57) ABSTRACT

A circuit of communication interface between dies is provided. The circuit includes a first interface of the first die having a serializer to serialize an input data of N bits a serialized data for transmitting out and a second interface of the second die having a de-serializer to receive and deserialize the serialized data into a de-serialized data. In addition, an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die. A clock generator provides a first clock to a first ripple counter of the serializer and a second clock to a second ripple counter of the de-serializer.

24 Claims, 9 Drawing Sheets

FIG. 5

CIRCUIT OF COMMUNICATION INTERFACE BETWEEN TWO DIES AND METHOD TO MANAGE COMMUNICATION INTERFACE

BACKGROUND

Technical Field

The invention is related to interface between two integrated circuit (IC) dies for data communication and more particularly to a circuit of communication interface between two dies and method to manage the communication interface between the two dies.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 2.5D semiconductor device, in which several circuit chips may be integrated as a larger integrated circuit, in which the contact elements, interposer or RDL layer are used to connect between the chips.

The packaging technology Integrated Fan-Out (InFO) and chip-on-wafer-on-substrate (CoWoS) have been proposed to package multiple chips assembled side by side.

As to a whole electronic circuit, the main circuit may be fabricated based on the 2.5D packaging technology. In addition, multiple application-specific integrated circuits (ASIC) dies and serializer/de-serializer (SerDes) dies may be additionally disposed on the main circuit in connection with each other through the interconnection interfaces, which involves a parallel bus.

The interfaces of two dies to be connected usually include contact element patterns, respectively, for connection to each other. The contact element pattern of a die includes a plurality of contact elements for connection to the contact elements of another die.

In communication, the contact elements of one die are connecting with contact elements of another die in parallel communication. Here, the communication physical layer in each die usually includes serializers to convert the parallel data into serial data. A set of serial data is transmitted to another die through one contact element. Then, the communication physical layer also includes de-serializer to convert the serial data into parallel data.

Each die includes a serializer and a de-serializer as one slice. Each die may include multiple slices. Two dies are connected based on the packaging technology, in which the serializer and the de-serializer of one die are connected to the de-serializer and the serializer of another die, respectively. The serializer is responsible for transmitting data and the de-serializer is responsible for receiving data. However, the clock in different rates is used in the serializer and the de-serializer corresponding to multiple stages, so as to serialize and de-serialize the data at each stage. How to efficiently provide the clock with proper clock rates for each of the stages is still an issue in design, based on 2.5D the packaging technology.

SUMMARY

The invention provides a circuit of communication interface between a first die and a second die based on the parallel bus. However, the data transmitted on the channels of the parallel bus is a serialized data. Each die is implemented with at least a serializer and a de-serialize to transmit data between two dies. The serializer and the de-serialize based on the clock may perform the serialization and de-serialization for data.

In an embodiment, a circuit of communication interface between a first die and a second die is provided. The circuit includes a first interface of the first die having a serializer to serialize an input data of N bits in parallel form into a serialized data for transmitting out and a second interface of the second die having a de-serializer to receive and deserialize the serialized data into a de-serialized data of the N bits in parallel form. In addition, an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die. A clock generator provides a first clock separate from the input data to a first ripple counter of the serializer and a second clock separate from the input data to a second ripple counter of the de-serializer, wherein the serializer and the de-serializer respectively use the first clock and the second clock in operation.

In an embodiment, a method to manage a communication interface between a first die and a second die is provided. The method includes implementing a first interface in the first die, including a serializer to serialize an input data of N bits in parallel form into a serialized data for transmitting out; implementing a second interface in the second die, including a de-serializer to receive and deserialize the serialized data into a de-serialized data of the N bits in parallel form. In addition, the method includes implementing an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die. A clock generator is also implemented to provide a first clock separate from the input data to a first ripple counter of the serializer and a second clock separate from the input data to a second ripple counter of the de-serializer, wherein the serializer and the de-serializer respectively use the first clock and the second clock in operation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5 is a drawing, schematically illustrating the structure of the contact element pattern, according to an embodiment of the invention.

DESCRIPTION OF THE EMBODIMENTS

The invention is directed to an interface between two integrated circuit (IC) dies for data communication. The contact elements of the two dies are correspondingly connected through connection interface, such as interposer or re-distribution layer (RDL) depending on the package process as taken. The parallel data of one die are serialized into serial data and then transmitted to a target die through the connection interface. The serial data as received by the target die need to be de-serialized into parallel data. The clock used in the de-serializers is also transmitted though one contact element of the connection interface. The phase of the clock needs to be properly adjusted, so as to correctly sample the serial data to de-serialize into parallel data.

The phase adjustment for the clock for the de-serializers is essential to assure the data to be correctly de-serialized. Multiple embodiments are provided for describing the invention but the invention is not just limited to the embodiments.

The packaging structure between dies fabricated as a semiconductor device is described first. At to the semiconductor fabrication, the interface for a 2.5D semiconductor device may be taken, in which dies are disposed on an interposer or RDL. The contact element patterns of the dies are configured to have geometrically symmetric relation. The dies are more freely connected through the interface. The routing lengths between contact elements in routing may also be more equally and shortly set.

In communication through the interface, the parallel data at the transmitting die usually are serialized into bit string in serial form. Various signals including the bit sting are transmitted to another die, as a receiving die, through the interface. The interface provides a parallel bus for transmitting the signals in serial form. Then, the receiving die needs to de-serialize the input data signals correctly, so as to correctly obtain the communication data as transmitted.

Several embodiments are provided for describing the invention but the invention is not just limited to the embodiments.

The whole integrated circuit may be fabricated by the semiconductor fabrication processes as a semiconductor device, which may be fabricated based on stack structure of 2.5D semiconductor device. The interface of the dies to receive data may include the frame decoding circuit in association with the de-serialized circuit. In an embodiment, the interface in semiconductor structure is integrated in the circuit of the whole die.

Figure 1:
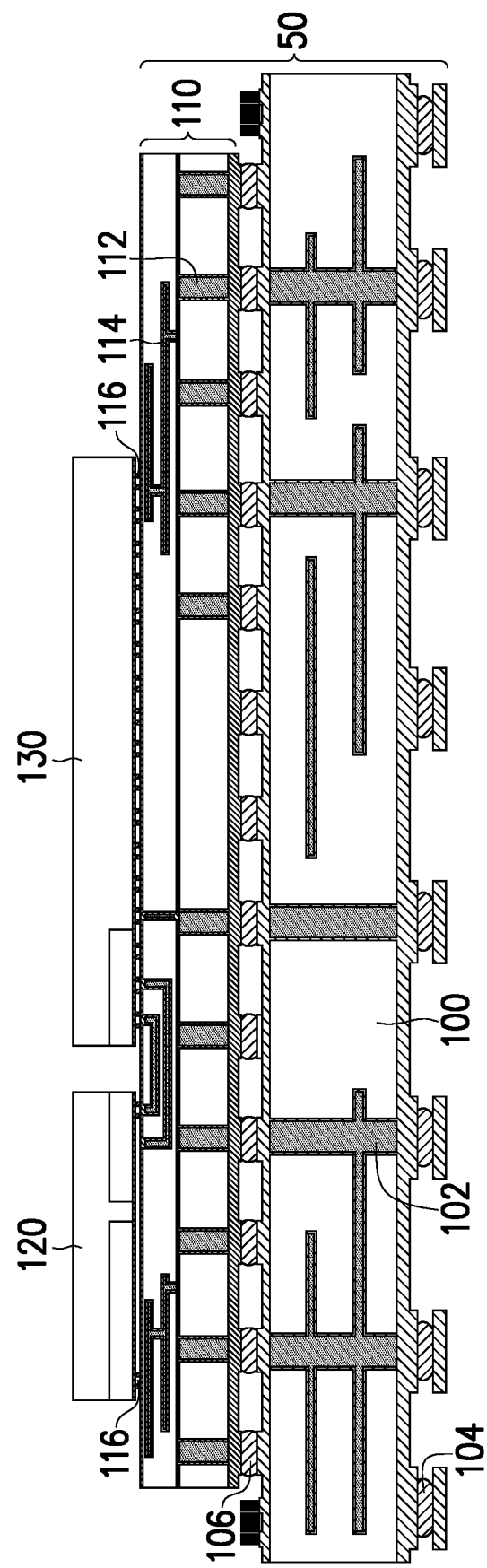
FIG. 1 is a drawing, schematically illustrating a cross-sectional stack structure of 2.5D semiconductor device with an interface, according to an embodiment of the invention.

The semiconductor fabrication is firstly described. FIG. 1 is a drawing, schematically illustrating a cross-sectional stack structure of 2.5D semiconductor device with an interface, according to an embodiment of the invention. Referring to FIG. 1, in further application, the CoWoS or InFO platform 50 with the intended IC structure is formed based on the 2.5D packaging technology. The CoWoS or InFO platform 50 may include a package substrate 100, which has the bottom solder balls 104 and the top contact elements 106. The via 102 may be used for connecting from the bottom solder balls 104 to the top contact elements 106. Further, interposer or RDL 110, may be further formed on the substrate 100 with the connection of the contact elements 106. The interposer or RDL 110 may also include the TSV 112, the interconnection routing 114, and the contact elements 116. Here, the contact elements 116 depending on the fabrication process as taken may be via or bumping pad or any suitable connecting structure for terminal-to-terminal in contact. The invention does not limit the contact elements 106 as a specific type.

In actual application, the CoWoS or InFO platform 50 may also be implemented with additional dies, such as the ASIC die 130 and SerDes die 120. The ASIC die 130 and SerDes die 120 are connected through the routing 114 and the contact elements 116. One ASIC die 130 may connect with multiple SerDes die 120 for various peripheral communication.

Figure 2:
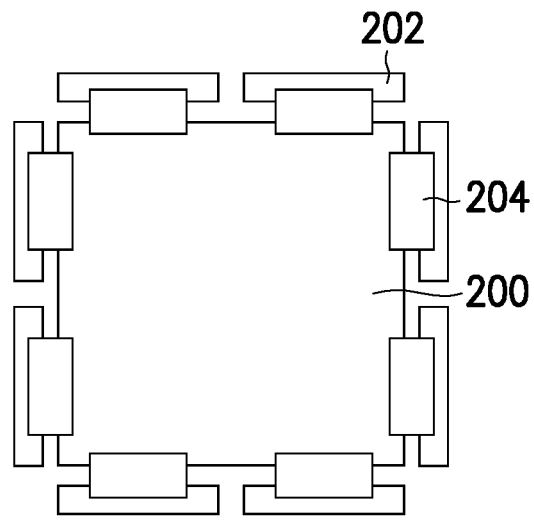
FIG. 2 is a drawing, schematically illustrating the interfaces for one die to connect to multiple other dies through the interfaces, according to an embodiment of the invention.

FIG. 2 is a drawing, schematically illustrating the interfaces for one die to connect to multiple other dies through the interfaces, according to an embodiment of the invention. Referring to FIG. 2, one IC die 200, such as a processor or ASIC die, may connect with multiple dies 202 through the interface 204. The interface 204 involves a parallel bus to communicate between the die 200 and the dies 202. The interface 204 may include routing and the contact elements in a contact element pattern, so that die 200 to die 202 may be connected.

Figure 3:
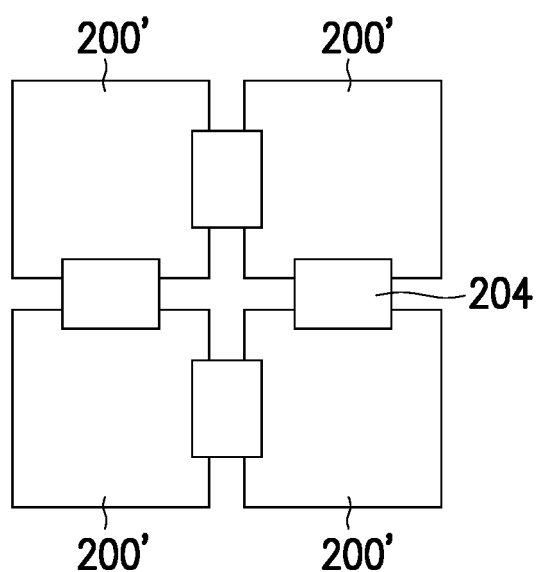
FIG. 3 is a drawing, schematically illustrating the interfaces for connection between multiple dies, according to an embodiment of the invention.

FIG. 3 is a drawing, schematically illustrating the interfaces for connection between multiple processor dies, according to an embodiment of the invention. Referring to FIG. 3, in another application, multiple processors 200' may be connected together to form a large processor with more powerful function. In this situation, these processors 200' are also connected by the interfaces 204.

As foregoing description, the 2.5D packaging process may be applied to stack various dies together side by side without substantially further consuming the device area. However, to allow the die to be more freely connected together, the contact elements in the interface 204 need to be properly arranged in compact manner and further be symmetric for receiving and transmitting signals. The communication between two die 200 to die 202 may be easily disposed at the peripheral region. Here, interface 204 may also referring to Glink interface as provided in the market.

Figure 4:
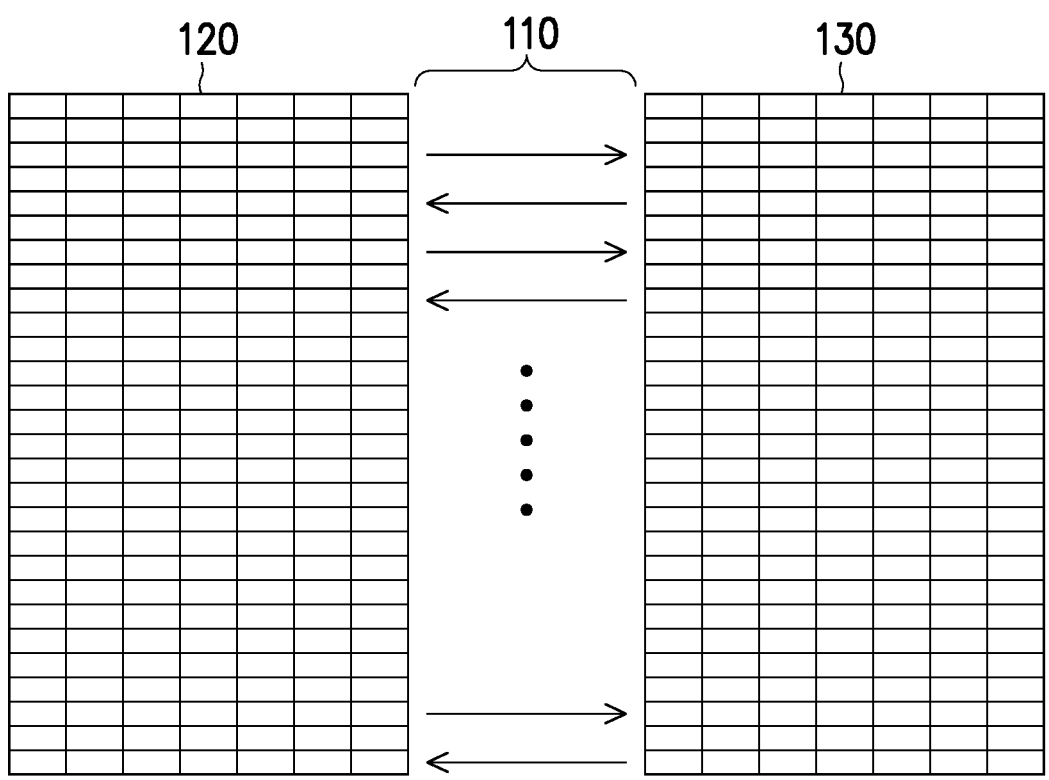
FIG. 4 is a drawing, schematically illustrating a communication between two dies based on the interface with the interposer or RLD, according to an embodiment of the invention.

FIG. 4 is a drawing, schematically illustrating a communication between two dies based on the interface with the interposer or RLD, according to an embodiment of the invention. Referring to FIG. 4, in an example, the ASIC die 130 and SerDes die 120 are communicating through the interposer or RDL 110. The contact elements of the ASIC die 130 and SerDes die 120 to contact to the interposer or RDL 110 are properly arranged. Each contact element may transmit one specific signal ate the same time. As a result, the parallel bus is set up based on the contract elements. The signals at each contact elements is in a serial form, such as a bit sting.

Figure 5:
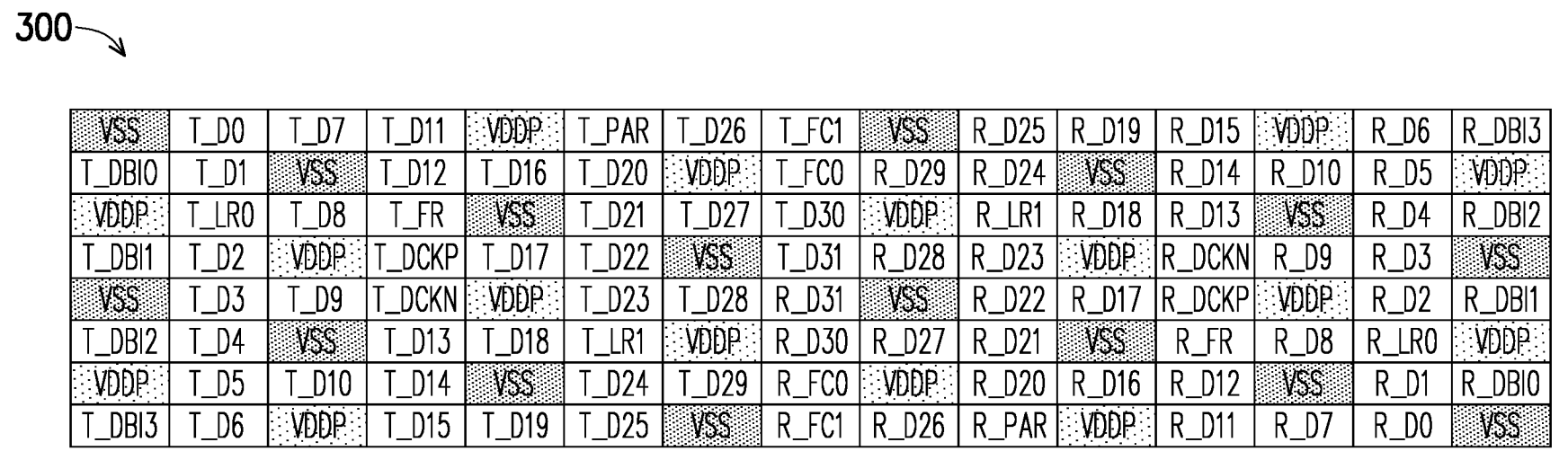

FIG. 5 is a drawing, schematically illustrating the structure of the contact element pattern, according to an embodiment of the invention. Referring to FIG. 5, the total number of the contact elements involved in the interface may be a number of signals are communicating in parallel for transmitting and receiving.

The total number of the bumps involved in the interface may be a large number. The signals are communicating in parallel between dies for transmitting and receiving. Depending on the size of the data in one bus, a data size of 32 bits with operation voltages and other function signals are set as one slice referred to a contact element pattern 300. The contact element pattern 300 may be replicated up to a certain number, such as 8, to adapt the total data size in parallel communication. In an example, the data is corresponding to 32 bits with a sequence of R_D0 to R_D31 and T_D0 to T_D31, on which T represents the bump for transmitting and R represents the bump for receiving. In addition, multiple low voltage signals VSS and multiple high voltage VDDP are also included in the contact element pattern 300. In addition, various function signals are also included, including FRAME T/R_FR; Clock T/R_DCK_P/N; Flow control T/R_FC[1:0]; DBI T/R_DBI [3:0]; Parity T/R_PAR; and Lane Repair T/R_LR[1:0]. However, the bumps for the functional signals are just not limited to the embodiment.

Table 1 is an example to define the bumps for one transmitting (T) group or receiving (R) group. The transmitting group and the receiving group have the same number of bumps.

TABLE 1

| Bump type | number | definition |
| --- | --- | --- |
| Data, T/R [31:0] | 32 | Data bits synchronous to CLK |
| FRAME, T/R_FRAME | 1 | FRAME bit synchronous to CLK |
| Clock, T/R_DCK_P/N | 2 | CLK differential pair |
| Flow Control, T/R_FC[1:0] | 2 | Asynchronous and in different direction to data bus |
| DBI, T/R_DBI[3:0] | 4 | One DBI per byte, serving to invert bus content for better SSO (single sign-on) |
| Parity, T/R_PAR | 1 | One per 32 bits, serving to identify error cases |
| Lan Repair, T/R_LR[1:0] | 2 | Lane repair bits, being used to repair data, parity and DBI, not used to repair CLK, FRAME and FC signals |

Based on the interposer or RDL 110 as described above, the various signals are communicated between two dies. However, in an example, a set of parallel signals in communication may be converted into a serial form to transmit/receive through one routing with one contact element. Once the data signals in serial form is received by the IC die, the IC die would de-serialize the data signals into a parallel form.

To assure the data signal in serial form to be correctly de-serialized, in an embodiment, a frame signal is provided to define N-bit data in each set. N in an example is 8 but the invention is not limited to 8. The parameter N is determined according to the actual data transmission algorithm. Here, 8-bit data form one byte. The following example takes 8-bit signal as an example for descriptions.

Based on the packaging process, the communication physical layers of two dies may be connected through the interposer or RDL 110, which serving as a parallel bus. However, each contact element of the parallel bus transmits the serialized data.

Based on the parallel but at the interposer or RDL 110, the reference clock is used in the serializers of one die and also transmitted through the parallel bus to the de-serializers on another die in communication. Since the reference clock and the serialized data are transmitted at the same time, the de-serializers needs to properly align/track the reference clock to correctly sample the serialized data into parallel data. The mechanisms of the serializer and the de-serializer in accordance with the reference clock is described.

Figure 6:
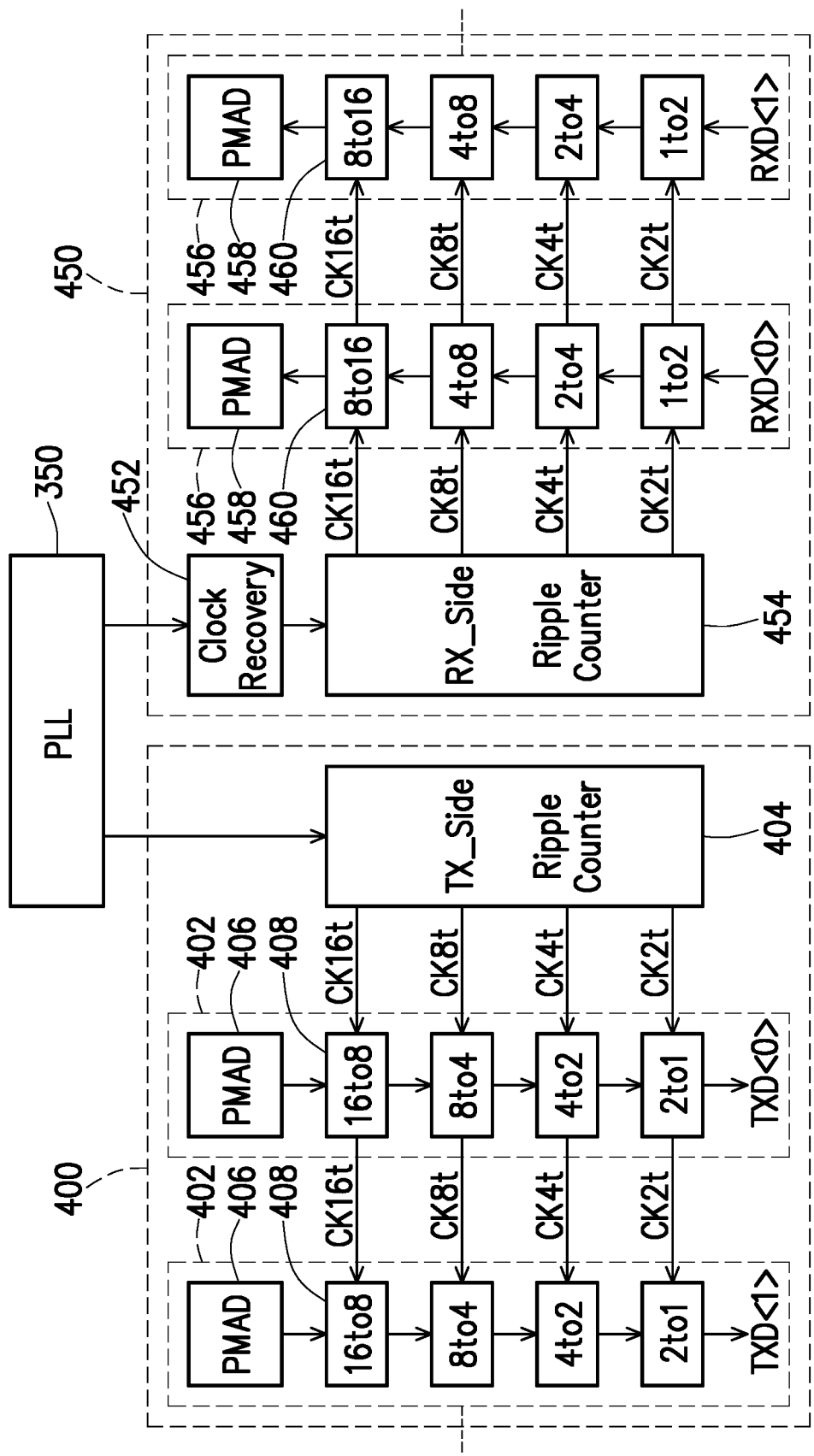
FIG. 6 is a drawing, schematically illustrating the mechanism of the serializer and the de-serializer, according to an embodiment of the invention.

FIG. 6 is a drawing, schematically illustrating the mechanism of the serializer and the de-serializer, according to an embodiment of the invention. Referring to FIG. 6, the data transmission operation between the serializer 402 of first die 400 to the de-serializer 456 at the second die 450, which is connected to the first die 400 through interposer or RDL 110. The reference clock from a phase locked loop (PLL) 350 is provided to the serializer 402 implemented in one die 400 and the de-serializer 456 implemented in another die 450. In an embodiment, the die 450 may also include a clock recovery circuit 452 to receive a forward clock from the phase locked loop (PLL) 350 and recover from the input clock as forwarded with proper phase adjustment, The clock after the clock recovery circuit 452 is used in the de-serializer 456.

In an embodiment, a plurality of serializers 402 is used to respectively serialize multiple parallel data corresponding to the serialized data indicated by TXD<0>, TXD<1>, . . . , and so on. Taking the serialized data TXD<0> in operation as an example for descriptions, the parallel data as stored in the data handle block, 406, indicated by PMAD. The parallel data in an example include 16 bits in parallel. Corresponding to example, four serializing units 408 are included in one serializers 402 for four serializing stages. The first serializing stage corresponding to processing on the 16 bits receives the reference clock with a clock rate as indicated by CK 16*t* from a ripple counter 404 at the transmission side, TX_Side. The serializing units 408 at the first stage serializes the 16 bits into to 8 parallel data signals. The ripple counter 404 provides the clock with four clock rates with frequency dividing by a factor of 2 in four stages. The smaller clock rate CK 16*t* is used in the serializing units 408 at the first stage because of 16 bits are transmitted in the same clock cycle, in which there is no need a fast clock rate. The serializing units 408 at the second serializing stage serializes the 8 data parallel data signals into 4 data parallel data signals, according to the clock rate CK 8*t*. Likewise, the last serializing stage includes one serializing unit 408 to serialize the two serialized data signals in parallel into one serialized data TXD<0>, which is to transmitted to the de-serializer 456 of the die 450 to recover the original parallel data. The serialized data TXD<0> as the received is indicated by RXD<0>. With the same mechanism, the serialized Data TX<1> is also serialized and then transmitted as the received data RXD<1> in die 450.

The clock from the PLL 350 is also divided by the ripple counter 454 in four stages at the receiving side as indicated by RX_Side, corresponding to 16 bits in the example. The clock frequency is sequentially divided by 2, similar to the ripple counter 404. The clock recovery 452 may be involved but not absolutely required. The clock recovery 452 may modify the phase of the clock from the PLL 350, so as to precisely sample the received data RXD<0>, RXD<1> in serialized form or in series form.

The de-serializing unit 460 at the first stage is to de-serialize one serialized data of 16 bits in the example into two temporarily parallel de-serialized data signals by an effect of 1 to 2. The clock rate as indicated by CK 2t needs to be sufficiently fast for sampling the series data of 16 bits. Likewise, the de-serializing unit 460 at the second stage to de-serialize the two de-serialized data signals into four de-serialized data signals by an effect of 2 to 4 with the clock rate CK 4t. Likewise, the de-serializing unit 460 at the third stage has an effect of 4 to 8 with the clock rate CK 8t. The de-serializing unit 460 at the last stage with respect to the 16 bits in the example has an effect of 8 to 16 with the clock rate CK 16t. The fully de-serialized data is stored to the data handle block 458, as also indicated by PMAD. The received data RXD<1> is de-serialized by the another de-serializer 456.

Figure 7:
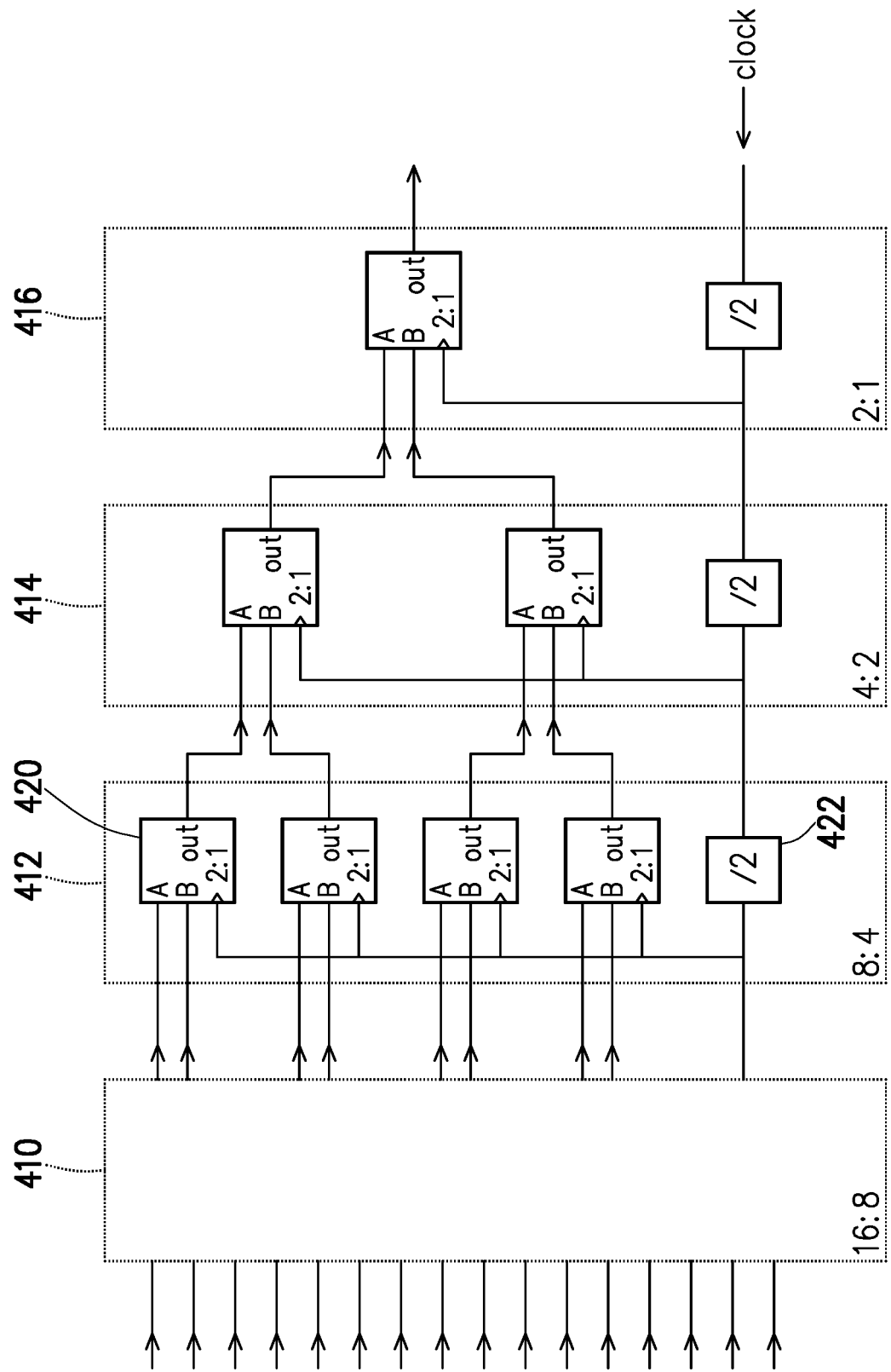
FIG. 7 is a drawing, schematically illustrating the structure of the serializer, according to an embodiment of the invention.

FIG. 7 is a drawing, schematically illustrating the structure of the serializer, according to an embodiment of the invention. Referring to FIG. 7, in further detail, one serializer with data signal routes are illustrated. Again, with the 16 bits in operation as an example, the first-stage serializing unit 410 receives 16 bits in parallel. first-stage serializing unit 410 has the serializing capability by serializing 16 channels into 8 channels, as indicated by 16:8. The second-stage serializing unit 412, the third-stage serializing unit 414 and the fourth-stage serializing unit 416 are involved in the example for respectively serializing the data signal channels as indicated by 8:4, 4:2 and 2:1. The clock are divided in frequency by 2 at the divider 422 in four stages, in which the first stage clock may be just the input clock without dividing frequency, in an example.

Taking the second-stage serializing unit 412 as an example to describe the serializing function. Four serializing blocks 420 are included to serialize the data signal channels from 8 to 4. Each serializing block 420 receives two input data signal channel and output one data signal channel, as indicated by 2:1, for the next serializing stage. Likewise, the third-stage serializing unit 414 includes two serializing blocks 420 to serialize the data signal channels from 4 to 2. The fourth-stage serializing unit 416 includes one serializing block 420 to serialize the data signal channels from 2 to 1.

Figure 8:
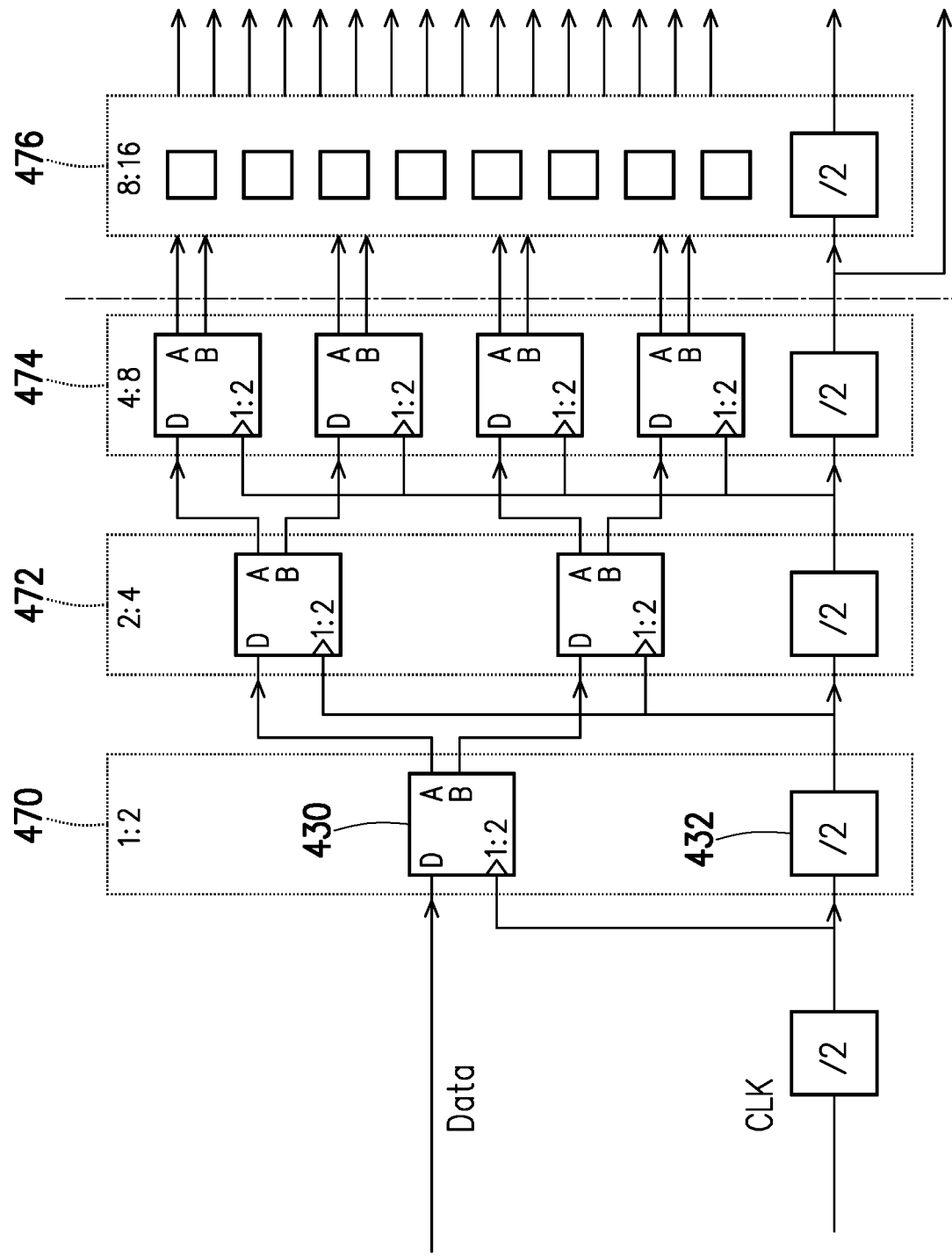
FIG. 8 is a drawing, schematically illustrating the structure of the de-serializer, according to an embodiment of the invention.

FIG. 8 is a drawing, schematically illustrating the structure of the de-serializer, according to an embodiment of the invention. Referring to FIG. 8, the original parallel data with 16 bits of the embodiment are fully serialized in FIG. 7 and then is received as the Data by the de-serializer. The clock CLK may be divided in frequency according to the actual need in the de-serializing units, including a first-stage de-serializing unit 470, a second-stage de-serializing unit 472, a third-stage de-serializing unit 474, and a fourth-stage de-serializing unit 476.

The first-stage de-serializing unit 470 as indicated by 1:2 includes one de-serializing block 430. Each de-serializing block 430 de-serializes one input data signal channel into two output data signal channels, as indicated by 1:2. Thus, the second-stage de-serializing unit 472 as indicated by 2:4 includes two de-serializing blocks 430. The third-stage de-serializing unit 474 as indicated by 4:8 includes four de-serializing blocks 430. The fourth-stage de-serializing unit 476 as indicated by 8:16 includes eight de-serializing blocks 430. As noted, 16 data signal channels in parallel are output from the fourth-stage de-serializing unit 476.

The number of stages in serializing and de-serializing is four stage with respect to data size of 16 bits but the invention is not limited to the fourth stages. It is depending on the data sizes as to be transmitted.

Figure 9:
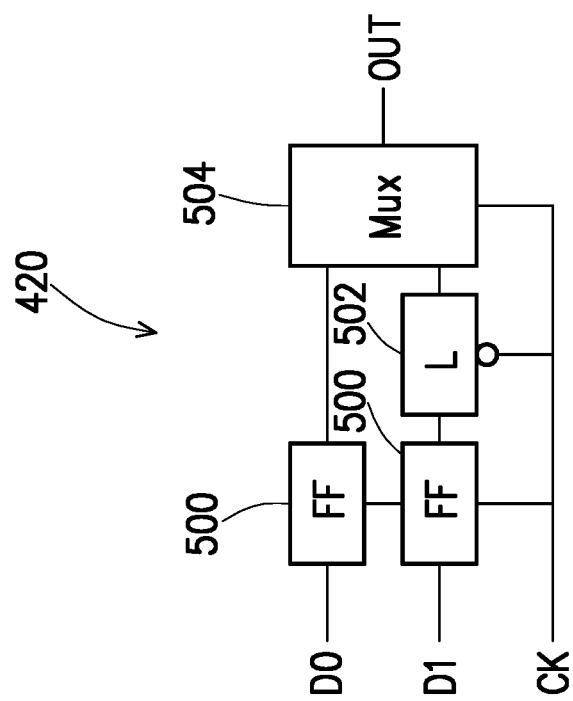
FIG. 9 is a drawing, schematically the structure of a serializing block, according to an embodiment of the invention.

FIG. 9 is a drawing, schematically the structure of a serializing block, according to an embodiment of the invention. Referring to FIG. 9, the serializing block 420 as also illustrated in FIG. 7 in an embodiment may include two flip-flop (FF) 500, respectively receive two input data signal channels, D0 and D1. In an example, the data D1 is latched by a latch L 502 connected after the FF 500. A multiplexer Mux 504 receives the data D0 through the FF 500 and the data D1 through the FF 500 and the latch L 502. The clock CK is generally used to control the FF 500, the latch L 502 and the multiplexer Mux 504. As a result, the data D0 and D1 in the multiplexer Mux 504 is sequentially output indicated by OUT, under control by the clock CK. The serializing block 420 may be implemented in multiple stages to serialize the parallel data into the series data, that is, the serialized data.

Figure 10:
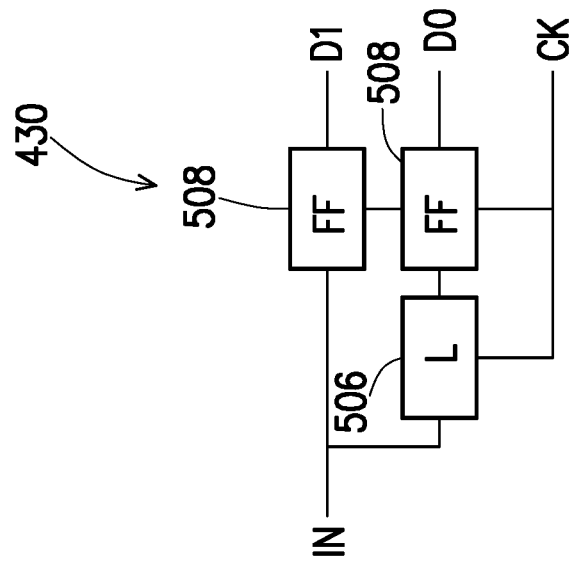
FIG. 10 is a drawing, schematically the structure of a de-serializing block, according to an embodiment of the invention.

FIG. 10 is a drawing, schematically the structure of a de-serializing block, according to an embodiment of the invention. Referring to FIG. 10, the de-serializing block 430 as also illustrated in FIG. 8 in an embodiment may include two flip-flop (FF) 508, respectively receive one input data signal IN, but one input data signal IN enters a latch L 506 before entering to the FF 508. The clock CK also controls the latch L 506 and the FF 508. In an example, the data D1 is output from one FF 508 without being latched. The data signal IN involving the latch L 506 would be de-serialized into data D0 in timing. As a result, the data D0 and the data D1 in two bits are in the parallel form for output. The de-serializing blocks 430 may be implemented in multiple stages to de-serialize the series data into the parallel data, that is, the de-serialized data.

Figure 11:
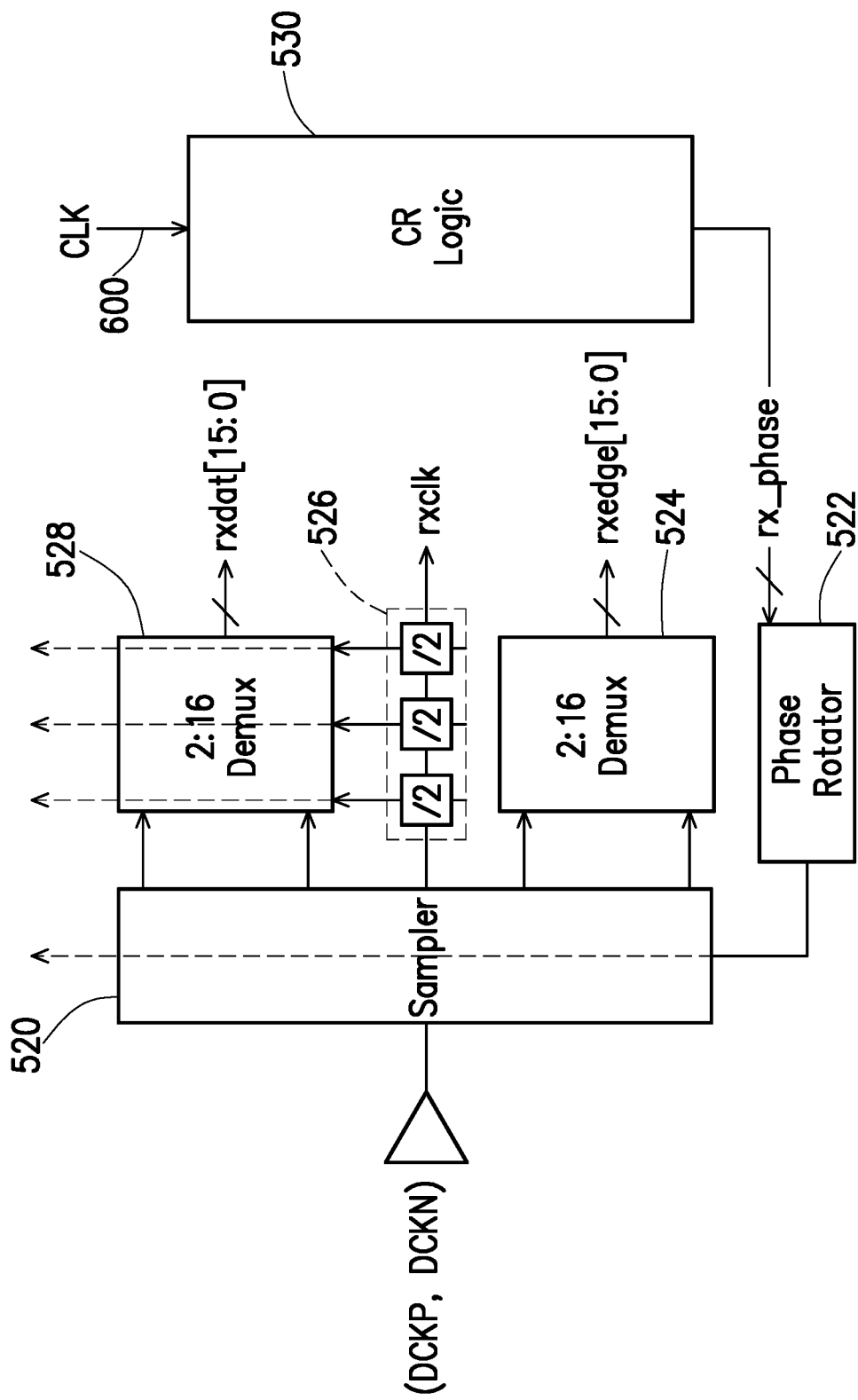
FIG. 11 is a drawing, schematically the structure of a de-serializer with clock recovery (CR) logic, according to an embodiment of the invention.

FIG. 11 is a drawing, schematically the structure of a de-serializer with clock recovery (CR) logic, according to an embodiment of the invention. Referring to FIG. 11 and also referring to a part of FIG. 6, the clock recovery (CR) logic 530 is included in the de-serializer may be extracted from the clock by the data signal itself. In general, the sampler 520 receives the reference clock DCKP, DCKN and provides the clock rxclk through multiple dividers in multiple stages. The de-serializer also passes the data signal to the de-multiplexer (Demux) 528 to output parallel data, rxdat [15:0] in 16 bits as an example, according to the clock rxclk with the clock rate. To extract the clock from the data itself, another de-multiplexer (Demux) 524 may directly produce the rising edges and the falling edges as rxedge[15:0]. The clock recovery (CR) logic 530 samples the rxdat[15:0] and the rxedge[15:0] to produce the phase value, rx_phase. This phase values rx_phase from the CR logic 530 are input to the phase rotator 522, which may provide the quantity to adjust the reference clock DCKP, DCKN and then have the sampling edges to be properly located at about the middle of a data eye, so as to correctly sample the data signal. The clock recovery (CR) logic 530, also referring to FIG. 6, receives an incoming forwarded clock 600, CLK, and the phase rotator 522 may provide the proper modification on the clock 600 so as to provide the clock used for sampling data. The clock 600 is applied separate from the data. The sampling clock in an embodiment is one for all sampling and de-serializing stages.

In the foregoing descriptions, some features may be realized as follows.

Typical Serdes recovers clock from data stream and uses recovered clock to sample the data. The invention as proposed transfers the clock as a separate net aside the data. The invention uses a clock forwarding scheme. So, clock may be not necessarily recovered from data, and the sampling clock is recovered from incoming forwarded clock. This manner may simplify much clock recovery and allow better sampling clock quality. The invention may afford transferring clock separately from data because CoWoS/InFO can transfer many routing traces.

In typical Serdes, every data lane is a separate interface. Every lane should recover clock from its data stream in order to sample data transferred by this lane. In an embodiment of the invention, one forwarded clock is shared by many data lanes. So, clock recovery may be also shared by many data lanes. One recovered clock can be used for sampling all data bits. It also simplifies much the circuit and reduces circuits and power. The invention may afford sampling many data lanes by the same clock because CoWoS/InFO allows accurate and identical routing traces and delays for all data lanes and the clock lanes.

Typical Serdes uses data stream in order to recover clock. So, data has to toggle all the time. Even when there is no data to transfer. Data randomization is used to have high toggle even when transferred data doesn't toggle enough. The invention recovers clock from a separate forwarded clock. Data don't have to toggle. Data may be transferred without randomization.

The invention may also be realized as a circuit of communication interface between a first die and a second die and a method to manage a communication interface between a first die and a second die.

In an embodiment, the circuit includes a first interface of the first die having a serializer to serialize an input data of N bits in parallel form into a serialized data for transmitting out and a second interface of the second die having a de-serializer to receive and deserialize the serialized data into a de-serialized data of the N bits in parallel form. In addition, an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die. A clock generator provides a first clock to a first ripple counter of the serializer and a second clock to a second ripple counter of the de-serializer.

In an embodiment, the method includes implementing a first interface in the first die, including a serializer to serialize an input data of N bits in parallel form into a serialized data for transmitting out; implementing a second interface in the second die, including a de-serializer to receive and deserialize the serialized data into a de-serialized data of the N bits in parallel form. In addition, the method includes implementing an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die. A clock generator is also implemented to provide a first clock to a first ripple counter of the serializer and a second clock to a second ripple counter of the de-serializer.

In an embodiment, as to the circuit and the method of communication interface and the method for managing the communication interface, the first ripple counter receives the first clock and sequentially divides a clock rate of the first clock by a factor of 2 in multiple serializing stages to sequentially provide a plurality of first frequency-divided clock signals corresponding to the serializing stages.

In an embodiment, as to the circuit of communication interface and the method for managing the communication interface, the serializer includes a plurality of first serializing units to respectively receive the input data of the N bits and the first frequency-divided clock signals from a highest clock rate to a lowest clock rate, wherein each of the first serializing units serialize an input data by a factor of 2 until the N bits of the input data are serialized into the serialized data.

In an embodiment, as to the circuit of communication interface and the method for managing the communication interface, a first serializing stage of the first serializing units receives the input data of the N bits in parallel form and serializes into N/2 transient serialized data, wherein a second serializing stage of the first serializing units sequentially receives the N/2 transient serialized data and serializes into N/2/2 transient serialized data, wherein a last serializing stage of the first serializing units receive two transient serialized data from a previous serializing stage into the serialized data.

In an embodiment, as to the circuit of communication interface and the method for managing the communication interface, N is a number of $2^M$, wherein M is integer greater than or equal to 4.

In an embodiment, as to the circuit of communication interface and the method for managing the communication interface, each of the first serializing units includes $2^L$ serializing blocks, where L is an integer corresponding to an operation of the corresponding serializing stage, wherein each of the serializing blocks serializes two input parallel data into two output series data.

In an embodiment, as to the circuit of communication interface and the method for managing the communication interface, the second ripple counter receives the second clock and sequentially divides a clock rate of the second clock by a factor of 2 in multiple serializing stages to sequentially provide a plurality of second frequency-divided clock signals corresponding to the de-serializing stages.

In an embodiment, as to the circuit of communication interface and the method for managing the communication interface, the de-serializer includes a plurality of de-serializing units to respectively receive the serialized data and the second frequency-divided clock signals from a highest clock rate to a lowest clock rate, wherein each of the de-serializing units de-serialize an input data by a factor of 2 until the N bits of the input data are de-serialized into the de-serialized data in parallel form.

In an embodiment, as to the circuit of communication interface and the method for managing the communication interface, a first de-serializing stage of the de-serializing units receives the serialized data with the N bits in series form and de-serializes into 2 transient de-serialized data, wherein a second de-serializing stage of the de-serializing units sequentially receives the 2 transient de-serialized data and de-serializes into 4 transient de-serialized data, wherein a last de-serializing stage of the de-serializing units receive N/2 transient de-serialized data from a previous de-serializing stage into the de-serialized data with the N bits in parallel form.

In an embodiment, as to the circuit of communication interface and the method for managing the communication interface, N is a number of $2^M$, wherein M is integer greater than or equal to 4.

In an embodiment, as to the circuit of communication interface and the method for managing the communication interface, each of the de-serializing units includes $2^L$ de-serializing blocks, where L is an integer corresponding to an operation of the corresponding de-serializing stage, wherein each of the de-serializing blocks de-serialize two input series data into two parallel data.

In an embodiment, as to the circuit of communication interface and the method for managing the communication interface, the second die further includes: a clock recovery logic to sample the de-serialized data and rising edges of the de-serialized data to determine a clock phase; and a phase rotator, receiving the clock phase to determine a phase offset to modify the second clock for the de-serializer.

In an embodiment, as to the circuit of communication interface and the method for managing the communication interface, the input data are transmitted by a double data rate (DDR).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit of communication interface between a first die and a second die, comprising:
    a first interface of the first die, including a serializer to serialize an input data of N bits in parallel form into a serialized data for transmitting out;
    a second interface of the second die, including a de-serializer to receive and deserialize the serialized data into a de-serialized data of the N bits in parallel form;
    an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die; and
    a clock generator, to provide a first clock separate from the input data to a first ripple counter of the serializer and a second clock separate from the input data to a second ripple counter of the de-serializer, wherein the serializer and the de-serializer respectively use the first clock and the second clock in operation,
    wherein the first ripple counter receives the first clock and sequentially divides a clock rate of the first clock by a factor of 2 in multiple serializing stages to sequentially provide a plurality of first frequency-divided clock signals corresponding to the serializing stages.

2. The circuit of communication interface as recited in claim 1, wherein the serializer includes a plurality of first serializing units to respectively receive the input data of the N bits and the first frequency-divided clock signals from a lowest clock rate to a highest clock rate, wherein each of the first serializing units serialize an input data by a factor of 2 until the N bits of the input data are serialized into the serialized data.

3. The circuit of communication interface as recited in claim 2, wherein a first serializing stage of the first serializing units receives the input data of the N bits in parallel form and serializes into N/2 transient serialized data, wherein a second serializing stage of the first serializing units sequentially receives the N/2 transient serialized data and serializes into N/2/2 transient serialized data, wherein a last serializing stage of the first serializing units receive two transient serialized data from a previous serializing stage into the serialized data.

4. The circuit of communication interface as recited in claim 2, wherein N is a number of 2M, wherein M is integer greater than or equal to 4.

5. The circuit of communication interface as recited in claim 2, each of the first serializing units includes 2L serializing blocks, where L is an integer corresponding to an operation of the corresponding serializing stage, wherein each of the serializing blocks serializes two input parallel data into two output series data.

6. The circuit of communication interface as recited in claim 2, wherein the second ripple counter receives the second clock and sequentially divides a clock rate of the second clock by a factor of 2 in multiple serializing stages to sequentially provide a plurality of second frequency-divided clock signals corresponding to the de-serializing stages.

7. The circuit of communication interface as recited in claim 6, wherein the de-serializer includes a plurality of de-serializing units to respectively receive the serialized data and the second frequency-divided clock signals from a highest clock rate to a lowest clock rate, wherein each of the de-serializing units de-serialize an input data by a factor of 2 until the N bits of the input data are de-serialized into the de-serialized data in parallel form.

8. The circuit of communication interface as recited in claim 7, wherein a first de-serializing stage of the de-serializing units receives the serialized data with the N bits in series form and de-serializes into 2 transient de-serialized data, wherein a second de-serializing stage of the de-serializing units sequentially receives the 2 transient de-serialized data and de-serializes into 4 transient de-serialized data, wherein a last de-serializing stage of the de-serializing units receive N/2 transient de-serialized data from a previous de-serializing stage into the de-serialized data with the N bits in parallel form.

9. The circuit of communication interface as recited in claim 7, wherein N is a number of 2M, wherein M is integer greater than or equal to 4.

10. The circuit of communication interface as recited in claim 6, wherein each of the de-serializing units includes 2L de-serializing blocks, where L is an integer corresponding to an operation of the corresponding de-serializing stage, wherein each of the de-serializing blocks de-serialize two input series data into two parallel data.

11. The circuit of communication interface as recited in claim 1, wherein the second die further includes:
    a clock recovery logic, receiving the second clock to determine a clock phase; and
    a phase rotator, receiving the clock phase to determine a phase offset to modify the second clock for the de-serializer.

12. The circuit of communication interface as recited in claim 1, wherein the input data are transmitted by a double data rate (DDR).

13. A method to manage a communication interface between a first die and a second die, comprising:
    implementing a first interface in the first die, including a serializer to serialize an input data of N bits in parallel form into a serialized data for transmitting out;
    implementing a second interface in the second die, including a de-serializer to receive and deserialize the serialized data into a de-serialized data of the N bits in parallel form;
    implementing an interconnection structure connected between the first die and the second die to connect the serializer and the de-serializer, wherein the interconnection structure is an interposer or a redistribution layer of a semiconductor structure to form a parallel bus for transmitting the serialized data in one line of the parallel bus between the first die and the second die; and implementing a clock generator, to provide a first clock separate from the input data to a first ripple counter of the serializer and a second clock separate from the input data to a second ripple counter of the de-serializer, wherein the serializer and the de-serializer respectively use the first clock and the second clock in operation, wherein the first ripple counter as implemented receives the first clock and sequentially divides a clock rate of the first clock by a factor of 2 in multiple serializing stages to sequentially provide a plurality of first frequency-divided clock signals corresponding to the serializing stages.

14. The method to manage the communication interface as recited in claim 13, wherein the serializer as implemented includes a plurality of serializing units to respectively receive the input data of the N bits and the first frequency-divided clock signals from a lowest clock rate to a highest clock rate, wherein each of the serializing units serialize an input data by a factor of 2 until the N bits of the input data are serialized into the serialized data.

15. The method to manage the communication interface as recited in claim 14, wherein a first serializing stage of the serializing units receives the input data of the N bits in parallel form and serializes into N/2 transient serialized data, wherein a second serializing stage of the serializing units sequentially receives the N/2 transient serialized data and serializes into N/2/2 transient serialized data, wherein a last serializing stage of the serializing units receive two transient serialized data from a previous serializing stage into the serialized data.

16. The method to manage the communication interface as recited in claim 14, wherein N is a number of 2M, wherein M is integer greater than or equal to 4.

17. The method to manage the communication interface as recited in claim 14, wherein each of the serializing units includes 2L serializing blocks, where L is an integer corresponding to an operation of the corresponding serializing stage wherein each of the serializing blocks serializes two input parallel data into two output series data.

18. The method to manage the communication interface as recited in claim 14, wherein the second ripple counter as implemented receives the second clock and sequentially divides a clock rate of the second clock by a factor of 2 in multiple serializing stages to sequentially provide a plurality of second frequency-divided clock signals corresponding to the de-serializing stages.

19. The method to manage the communication interface as recited in claim 18, wherein the de-serializer as implemented includes a plurality of de-serializing units to respectively receive the serialized data and the second frequency-divided clock signals from a highest clock rate to a lowest clock rate, wherein each of the de-serializing units de-serialize an input data by a factor of 2 until the N bits of the input data are de-serialized into the de-serialized data in parallel form.

20. The method to manage the communication interface as recited in claim 19, wherein a first de-serializing stage of the de-serializing units receives the serialized data with the N bits in series form and de-serializes into 2 transient de-serialized data, wherein a second de-serializing stage of the de-serializing units sequentially receives the 2 transient de-serialized data and de-serializes into 4 transient de-serialized data, wherein a last de-serializing stage of the de-serializing units receive N/2 transient de-serialized data from a previous de-serializing stage into the de-serialized data with the N bits in parallel form.

21. The method to manage the communication interface as recited in claim 19, wherein N is a number of 2M, wherein M is integer greater than or equal to 4.

22. The method to manage the communication interface as recited in claim 18, each of the de-serializing units includes 2L de-serializing blocks, where L is an integer corresponding to an operation of the corresponding de-serializing stage, wherein each of the de-serializing blocks de-serializes two input series data into two output parallel data.

23. The method to manage the communication interface as recited in claim 13, wherein the second die further includes implementing:

a clock recovery logic, receiving the second clock to determine a clock phase; and a phase rotator, receiving the clock phase to determine a phase offset to modify the second clock for the de-serializer.

24. The method to manage the communication interface as recited in claim 13, wherein the input data are transmitted by a double data rate (DDR).

* * * * *